US006849379B2

(12) United States Patent
Oohashi et al.

(10) Patent No.: US 6,849,379 B2
(45) Date of Patent: Feb. 1, 2005

(54) LITHOGRAPHIC PRINTING PLATE PRECURSOR

(75) Inventors: Hidekazu Oohashi, Shizuoka (JP); Shinnichi Morishima, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/262,065

(22) Filed: Oct. 2, 2002

(65) Prior Publication Data

US 2003/0129522 A1 Jul. 10, 2003

(30) Foreign Application Priority Data

Oct. 3, 2001 (JP) .................................... P. 2001-307616

(51) Int. Cl.$^7$ ................................................ G03F 7/004

(52) U.S. Cl. ................. 430/270.1; 430/138; 430/273.1; 430/302; 430/309; 430/348

(58) Field of Search .............................. 430/138, 270.1, 430/271.1, 273.1, 302, 309, 348

(56) References Cited

U.S. PATENT DOCUMENTS 3,628,953 A * 12/1971 Brinckman ................. 430/325
4,004,924 A * 1/1977 Vrancken et al. ........... 430/325
6,225,024 B1 * 5/2001 Morishima et al. .... 430/270.18
6,558,880 B1 * 5/2003 Goswami et al. ........... 430/350
6,573,022 B1 * 6/2003 Miyake et al. ........... 430/270.1
6,579,662 B1 * 6/2003 Zheng et al. ............ 430/281.1
6,646,132 B2 * 11/2003 Morishima et al. ......... 546/347
2002/0009669 A1 * 1/2002 Morishima et al. .... 430/270.18
2002/0081522 A1 * 6/2002 Miyake et al. ........... 430/270.1
2003/0064205 A1 * 4/2003 Morishima et al. ......... 428/195
2003/0091932 A1 * 5/2003 Loccufier et al. ........ 430/272.1

FOREIGN PATENT DOCUMENTS

EP 962 923 A1 * 12/1999 ............ G11B/7/24
JP 10-337962 12/1998
JP 11-277927 10/1999
JP 2001-33953 2/2001

* cited by examiner

*Primary Examiner*—Barbara L. Gilliam
(74) *Attorney, Agent, or Firm*—Sughrue Mion, PLLC

(57) ABSTRACT

A lithographic printing plate precursor having an image-forming layer capable of drawing images by heat or heat mode exposure, which comprises a support and a layer containing a heat decomposable dye having an absorption maximum wavelength in a visible region, not substantially having an absorption in an oscillation wavelength of a laser used for heat mode exposure, and having a heat decomposition initiation temperature of 250° C. or lower.

11 Claims, No Drawings

LITHOGRAPHIC PRINTING PLATE PRECURSOR

FIELD OF THE INVENTION

The present invention relates to a lithographic printing plate precursor capable of drawing images by heat or heat mode exposure, in particular, to a lithographic printing plate precursor forming printout images that can be visibly confirmed with ease after drawing the images by heat or heat mode exposure.

BACKGROUND OF THE INVENTION

Hitherto, the preparation of printing plates for lithographic printing has been carried out in a system in which a printing plate precursor is exposed to light through a lith film as an intermediate material. However, in recent years, as the digitalization rapidly proceeds in the printing field, the preparation step of the printing plate is being changed to a computer-to-plate (CTP) system in which digital data input and edited in a computer are directly output to a printing plate precursor. As the printing plate precursor for CTP, are proposed various modes as described, for example, in *Journal of Printing Science and Technology*, Vol. 36, pp. 97–104 and pp. 148–163 (1999). Of these are also actively studied lithographic printing plate precursors capable of drawing images by heat or heat mode exposure.

Even in such a lithographic printing plate precursor capable of drawing images by heat or heat mode exposure, like in conventional lithographic printing plate precursors, it is important in the printing plate preparation work to discriminate whether or not the precursor is already exposed to light, to inspect images on the printing plate, and to distinguish the plate to which what color of inks should be applied. In particular, since development is not carried out in a printing plate requiring no development, inspection and discrimination of the plate are difficult in mounting the plate on a printing press, and hence, a method for compensating these difficulties is required.

To solve such difficulties, JP-A-11-2717927 (the term "JP-A" as used herein means an "unexamined published Japanese patent application") describes a printing plate comprising, on a support, a recording layer containing a light-heat converting agent, a compound generating an acid, a base or a radical by light or heat, and a compound that discolors by a mutual action with the generated acid, base or radical, which can be exposed with an infrared laser and has exposed image-visualizing property (printout property).

However, the compound generating an acid or a radical, which is suitable for obtaining a printout image as described in the above patent, has an absorption in a visible light region. Accordingly, in the printing plate using such a compound, the acid or radical is generated during standing in a light room before or after the imagewise exposure, to cause discoloration. As a result, there are involved problems such that the generation of the printout image during imagewise exposure is inhibited and that the generated printout image becomes unclear during a time when the plate exposed imagewise is allowed to stand.

JP-A-2001 -33953 describes that in a light-sensitive material comprising, on a support, a recording layer containing an electron-accepting polymer soluble in an alkaline developing solution and a near infrared-absorptive dye, when near infrared light is irradiated, the optical reflection density in the irradiated area of the recording layer decreases so that drawn images can be visually confirmed at the time of completion of the exposure. However, the dye used in the technology is an electron-donating dye precursor, from which a readily visual printout image can be obtained only in the presence of the electron-accepting polymer, and hence, such a dye is not a general-purpose dye for printout.

SUMMARY OF THE INVENTION

An object of the invention is to provide a lithographic printing plate precursor having good printout property, which can overcome the above-described problems and is capable of drawing images by heat or heat mode exposure. Another object of the invention is to provide a lithographic printing plate precursor having good printout property and capable of being subjected to printing without processing such as development, after drawing images.

The present inventors have been able to achieve the above-described objects by using a heat decomposable dye having an absorption maximum wavelength in a visible region and not substantially having an absorption in an oscillation wavelength of a laser used for heat mode exposure. Specifically, the invention includes the following lithographic printing plate precursors.

1. A lithographic printing plate precursor having an image-forming layer capable of drawing images by heat or heat mode exposure, which comprises a support and a layer containing a heat decomposable dye having an absorption maximum wavelength in a visible region, not substantially having an absorption in an oscillation wavelength of a laser used for heat mode exposure, and having a heat decomposition initiation temperature of 250° C. or lower.
2. The lithographic printing plate precursor as described in item 1 above, wherein the lithographic printing plate precursor is a lithographic printing plate precursor that can be mounted directly on a printing press without a development processing after exposure.
3. The lithographic printing plate precursor as described in item 1 or 2 above, wherein the heat decomposable dye has a structure represented by the following formula (1) or (2):

(1)

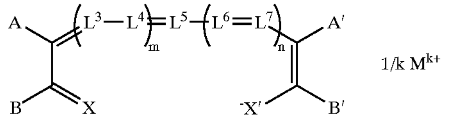

(2)

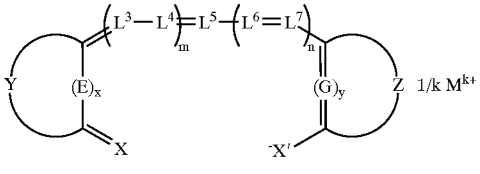

wherein, A, A', B, and B' each independently represents a substituent; Y and Z each represents an atomic group necessary for forming a carbon ring or a heterocyclic ring; E and G each represents an atomic group to complete a conjugated double bond chain; X and X' each represents oxygen, N—R, or $C(CN)_2$; R represents an alkyl group or an aryl group; $L^3$, $L^4$, $L^5$, $L^6$, and $L^7$ each represents a methine group which may be substituted; $M^{k+}$ represents an onium ion; m and n each independently represents 0, 1, or 2; x and y each independently represents 0 or 1; and k represents an integer of 1 or more.
4. The lithographic printing plate precursor as described in item 1 above, wherein the image-forming layer comprises a hydrophobic polymer compound that can be rendered hydrophilic by heat and has a functional group selected from a sulfonic ester group, a sulfonimido group and a disulfone group.

5. The lithographic printing plate precursor as described in item 1 above, wherein the image-forming layer comprises fine particles of a thermoplastic hydrophobic polymer.
6. The lithographic printing plate precursor as described in item 1 above, wherein the image-forming layer comprises microcapsules encapsulating an oleophilic compound.
7. The lithographic printing plate precursor as described in item 1 above, wherein the lithographic printing plate precursor is a lithographic printing plate precursor comprising a hydrophilic layer provided on an oleophilic layer, which is subjected to heat mode laser exposure to remove imagewise the hydrophilic layer by ablation, thereby forming images.

DETAILED DESCRIPTION OF THE INVENTION

In the invention, in order to obtain printout images, is used a heat decomposable dye having an absorption maximum wavelength in a visible region, not substantially having an absorption in an oscillation wavelength of a laser used for heat mode exposure, and having a heat decomposition initiation temperature of 250° C. or lower. Since the dye is insensitive to a visible light, there is no problem of occurrence of fogging during handling in a light room. Further, the invention is not restricted with respect to a combination of an electron-donating dye precursor with an electron-accepting polymer, which is essential in the conventional technology for the purpose of obtaining good printout images, but can provide good printout images through any combination with polymers.

JP-A-10-337962 describes a heat-sensitive recording material comprising, on a support, a recording layer containing a ultraviolet-absorptive substance having a maximum absorption at from 330 to 430 nm or a dye having an absorption maximum in a visible region, and an infrared-absorptive substance to lower the maximum absorption intensity of the ultraviolet-absorptive substance or dye upon irradiation with a laser having an oscillation wavelength within the range of from 750 to 900 nm. In the heat-sensitive recording material, what the maximum absorption intensity of the ultraviolet-absorptive substance or dye is lowered upon irradiation with a laser is estimated to be caused by the matter that a redox reaction occurs between the infrared-absorptive substance and the ultraviolet-absorptive substance, or between the infrared-absorptive substance and the dye, at high temperature upon heating within a short period of time, whereby the ultraviolet-absorptive substance or the dye is decomposed. Also, the heat-sensitive recording material is aimed to form a negative used for contact exposure to a PS plate or a photomask, and the above-cited patent does not describe a lithographic printing plate. Accordingly, this technology does not at all disclose or even suggest the dissolution of the above-described problems as in the invention, in which printout property is imparted to the lithographic printing plate precursor using a heat decomposable dye that is decomposed singly by heat.

The invention will be described in more detail below.

The heat decomposable dye, which is used in the lithographic printing plate precursor according to the invention, is a dye having an absorption maximum wavelength in a visible region, not substantially having an absorption in an oscillation wavelength of a laser used for heat mode exposure, and having a heat decomposition initiation temperature of 250° C. or lower. The dye not substantially having an absorption in an oscillation wavelength of a laser used for heat mode exposure means a dye that makes it impossible to form printout images, when a light-heat converting agent is removed from a layer containing the heat decomposable dye or a layer adjacent thereto. Namely, in the case of heat mode exposure, the heat decomposable dye used in the invention absorbs a heat generated by the light-heat converting agent to cause decomposition.

The heat decomposable dye that is used in the lithographic printing plate precursor according to the invention is subjected to heat decomposition to exhibit a hue different from that before the decomposition. By such change in the hue, a difference in the hue is generated between image areas and non-image areas of an image-forming layer, whereby it becomes easy to confirm the drawn images. Therefore, good printout images are obtained by using any polymer in the image-forming layer.

The heat decomposition initiation temperature of the heat decomposable dye used in the invention means a temperature at which the start of weight reduction or heat absorption/generation caused by the heat decomposition is observed, when the dye is measured at a temperature elevation rate of 10° C./min by means of a TG-DTA measurement device.

Although any dye can be used as the heat decomposable dye used in the lithographic printing plate precursor according to the invention so far as it meets the above-described requirements, dyes represented by the following formula (1) or (2) are particularly preferable.

(1)

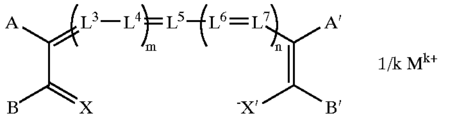

(2)

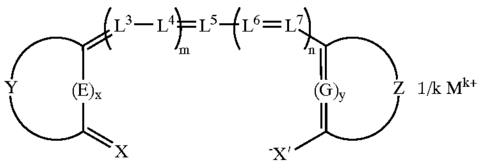

wherein, A, A', B, and B' each independently represents a substituent; Y and Z each represents an atomic group necessary for forming a carbon ring or a heterocyclic ring; E and G each represents an atomic group to complete a conjugated double bond chain; X and X' each represents oxygen, N—R, or $C(CN)_2$; R represents an alkyl group or an aryl group; $L^3$, $L^4$, $L^5$, $L^6$, and $L^7$ each represents a methine group which nay be substituted; $M^{k+}$ represents an onium ion; m and n each independently represents 0, 1, or 2; x and y each independently represents 0 or 1; and k represents an integer of 1 or more.

Examples of the substituent represented by A, A', B or B' include a substituted or unsubstituted, linear, branched or cyclic alkyl group having from 1 to 18 carbon atoms, and preferably from 1 to 8 carbon atoms (such as methyl, ethyl, propyl, isopropyl, n-butyl, isobutyl, sec-butyl, tert-butyl, cyclohexyl, methoxyethyl, ethoxycarbonylethyl, cyanoethyl, diethylaminoethyl, hydroxyethyl, chloroethyl, and acetoxyethyl); a substituted or unsubstituted aralkyl group having from 7 to 18 carbon atoms, and preferably from 7 to 12 carbon atoms (such as benzyl and carboxybenzyl); an alkenyl group having from 2 to 18 carbon atoms, and preferably from 2 to 8 carbon atoms (such as vinyl); an alkynyl group having from 2 to 18 carbon atoms, and preferably from 2 to 8 carbon atoms (such as ethynyl); a substituted or unsubstituted aryl group having from 6 to 18 carbon atoms, and preferably from 6 to 10 carbon atoms (such as phenyl, 4-methylphenyl, 4-methoxyphenyl, 4-carboxyphenyl, and 3,5-dicarboxyphenyl); a substituted or unsubstituted acyl group having from 2 to 18 carbon atoms, and preferably from 2 to 8 carbon atoms (such as acetyl, propionyl, butanoyl, and chloroacetyl); a substituted or unsubstituted sulfonyl group having from 1 to 18 carbon atoms, and preferably from 1 to 8 carbon atoms (such as methanesulfonyl and p-toluenesulfonyl); a sulfinyl group having from 1 to 18 carbon atoms, and preferably from 1 to 8 carbon atoms (such as methanesulfinyl, ethanesulfinyl, and octanesulfinyl); an alkoxycarbonyl group having from 2 to 18 carbon atoms, and preferably from 2 to 8 carbon atoms (such as methoxycarbonyl and ethoxycarbonyl); an aryloxycarbonyl group having from 7 to 18 carbon atoms, and preferably from 7 to 12 carbon atoms (such as phenoxycarbonyl, 4-methylphenoxycarbonyl, and 4-methoxyphenoxycarbonyl); a substituted or unsubstituted alkoxy group having from 1 to 18 carbon atoms, and preferably from 1 to 8 carbon atoms (such as methoxy, ethoxy, n-butoxy, and methoxyethoxy); a substituted or unsubstituted aryloxy group having from 6 to 18 carbon atoms, and preferably from 6 to 10 carbon atoms (such as phenoxy and 4-methoxyphenoxy); an alkylthio group having from 1 to 18 carbon atoms, and preferably from 1 to 8 carbon atoms (such as methylthio and ethylthio); an arylthio group having from 6 to 10 carbon atoms (such as phenylthio); a substituted or unsubstituted acyloxy group having from 2 to 18 carbon atoms, and preferably from 2 to 8 carbon atoms (such as acetoxy, ethylcarbonyloxy, cyclohexylcarbonyloxy, benzoyloxy, and chloroacetyloxy); a substituted or unsubstituted sulfonyloxy group having from 1 to 18 carbon atoms, and preferably from 1 to 8 carbon atoms (such as methanesulfonyloxy); a carbamoyloxy group having from 2 to 18 carbon atoms, and preferably from 2 to 8 carbon atoms (such as methylcarbamoyloxy and diethylcarbamoyloxy); a substituted or unsubstituted amino group having from 0 to 18 carbon atoms, and preferably from 0 to 8 carbon atoms (such as unsubstituted amino, methylamino, dimethylamino, diethylamino, anilino, methoxyphenylamino, chlorophenylamino, morpholino, piperidino, pyrrolidino, pyridylamino, methoxycarbonylamino, n-butoxycarbonylamino, phenoxycarbonylamino, methylcarbamoylamino, phenylcarbamoylamino, ethylthiocarbamoylamino, methylsulfamoylamino, phenylsulfamoylamino, acetylamino, ethylcarbonylamino, ethylthiocarbonylamino, cyclohexylcarbonylamino, benzoylamino, chlorocaetylamino, methanesulfonylamino, and benzenesulfonylamino); a substituted or unsubstituted carbamoyl group having from 1 to 18 carbon atoms, and preferably from 1 to 8 carbon atoms (such as unsubstituted carbamoyl, methylcarbamoyl, ethylcarbamoyl, n-butylcarbamoyl, tert-butylcarbamoyl, dimethylcarbamoyl, morpholinocarbamoyl, and pyrrolidinocarbamoyl); a substituted or unsubstituted sulfamoyl group having from 0 to 18 carbon atoms, and preferably from 0 to 8 carbon atoms (such as unsubstituted sulfamoyl, methylsulfamoyl, and phenylsulfamoyl); a halogen atom (such as fluorine, chlorine, and bromine); a hydroxy group; a nitro group; a cyano group; a carboxyl group; and a heterocyclic group (such as oxazole, benzoxazole, thiazole, benzothiazole, imidazole, benzimidazole, indolenine, pyridine, sulfolane, furan, thiphene, pyrrazole, pyrrole, chroman, and coumalin).

As the substituent represented by A or A' are preferable those having a Hammett's substituent constant, $\sigma p$ value of 0.2 or more. The Hammett's substituent constant is described, for example, in *Chem. Rev.*, Vol. 91, 165(1991). Particularly preferred examples of the substituent include a cyano group, a nitro group, an alkoxycarbonyl group, an acyl group, a carbamoyl group, a sulfamoyl group, and a sulfonyl group.

As the substituent represented by B or B' are preferable an alkyl group, an aryl group, an alkoxy group, and an amino group.

Since —C—$(E)_x$—C(═X)— bonding to Y and —C═$(G)_y$═C(—X'$^-$)— bonding to Z are in a conjugated state with each other, the carbocyclic ring or heterocyclic ring represented Y and —C—$(E)_x$—C(═X)— bonding to Y, and the carbocyclic ring or heterocyclic ring represented by Z and —C═$(G)_y$═C(—X'$^-$)— bonding to Z may be respectively considered as one of resonance structures. The carbocyclic ring or heterocyclic ring is hereinafter referred to as a carbocyclic ring or heterocyclic ring represented by Y and Z, and —C—[$(E)_x$ and $(G)_y$]—C(═X and X')— bonding thereto for the sake of convenience. As the carbocyclic ring or heterocyclic ring represented by Y and Z, and —C—[$(E)_x$ and $(G)_y$]—C(═X and X')— bonding thereto are preferable 4-membered, 5-membered, 6-membered, and 7-membered rings, with the 5-membered and 6-membered rings being particularly preferred. These rings may be further taken together with other 4-membered, 5-membered, 6-membered, or 7-membered ring to form a fused ring. These rings may have a substituent. As the substituent are employable those as enumerated above for A, A', B, and B'. As a hetero atom forming the heterocyclic ring are preferable B, N, O, S, Se, and Te, with N, O, and S being particularly preferred. x and y each indenptently represents 0 or 1, and preferably 0.

X and X' each represents any one of oxygen, N—R, and $C(CN)_2$, and preferably oxygen. Examples of the carbocyclic ring formed by Y and Z, and —C—[$(E)_x$ and $(G)_y$]—C(═X and X')— bonding thereto are enumerated below.

BB-1

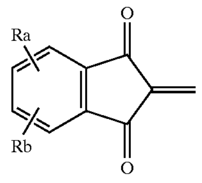

BB-2

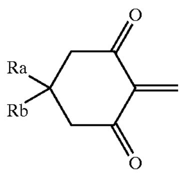

BB-3

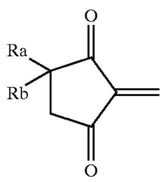

-continued
BB-4
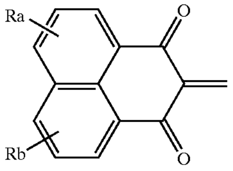
Of these carbocyclic rings are preferable BB-1 and BB-4.
Examples of the heterocyclic ring formed by Y and Z, and —C—[$(E)_x$ and $(G)_y$]—C(═X and X')— bonding thereto are enumerated below:
BB-5
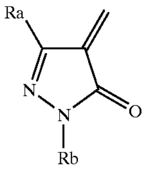
BB-6
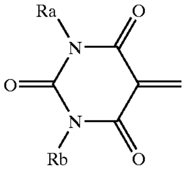
BB-7
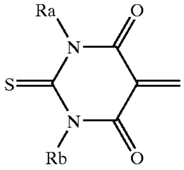
BB-8
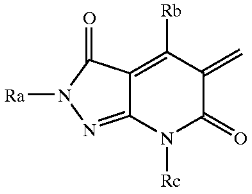
BB-9
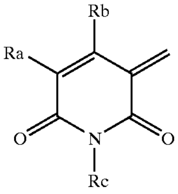
BB-10
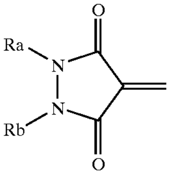
BB-11
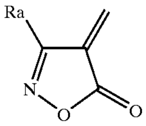
-continued
BB-12
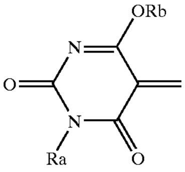
BB-13
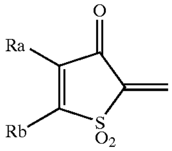
BB-14
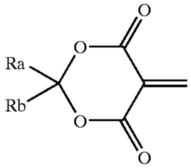
BB-15
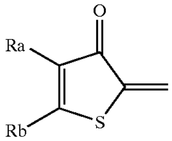
BB-16
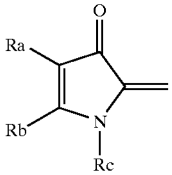
BB-17
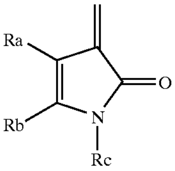
BB-18
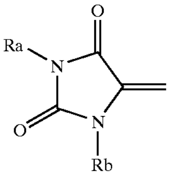
BB-19
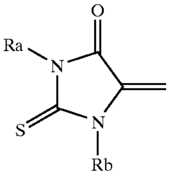
BB-20
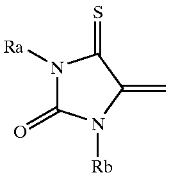

-continued
BB-21
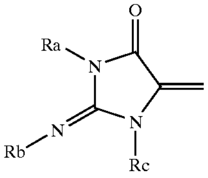
BB-22
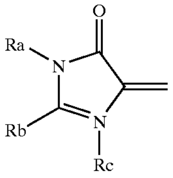
BB-23
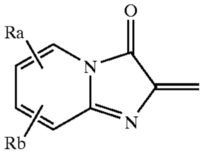
BB-24
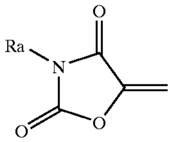
BB-25
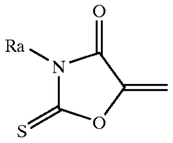
BB-26
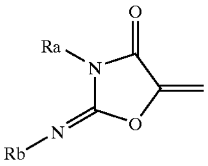
BB-27
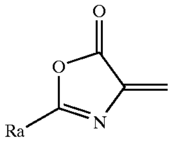
BB-28
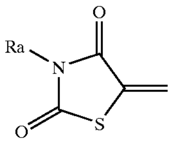
BB-29
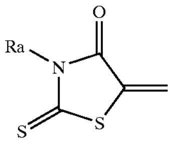
BB-30
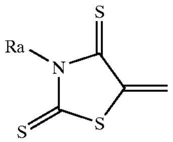
-continued
BB-31
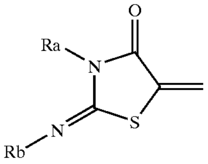
BB-32
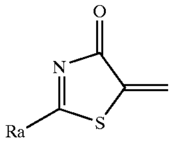
BB-33
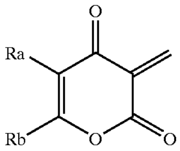
BB-34
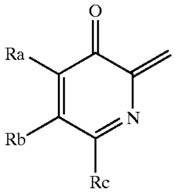
BB-35
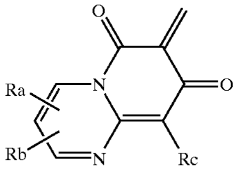
BB-36
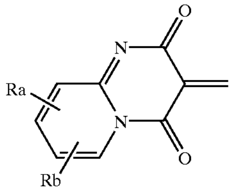
BB-37
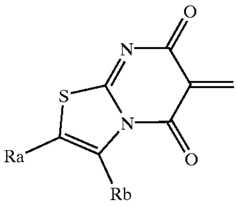
BB-38
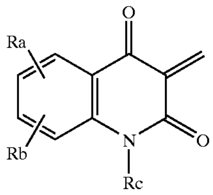

-continued

BB-39

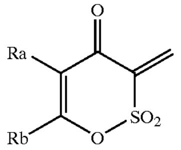

BB-40

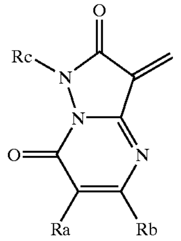

BB-41

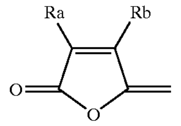

Of these heterocyclic rings are preferable BB-5, BB-6, BB-7, BB-11, BB-14, and BB-39.

Ra, Rb, and Rc each independently represents a hydrogen atom or a substituent. The substituent represented by Ra, Rb, or Rc has the same meaning as the substituent represented by A, A', B, and B', or the substituents are connected to each other to form a ring. Examples of the ring formed include a cyclohexane ring and a benzene ring.

The methine groups represented by $L^3$, $L^4$, $L^5$, $L^6$, and $L^7$ may be the same or different and may have a substituent. The substituent has the same meaning as the substituent represented by each of A, A', B, and B'. Preferred examples of the substituent include an alkyl group, an aralkyl group, an aryl group, an alkoxy group, an aryloxy group, an alkylthio group, an arylthio group, a halogen atom, an amino group, a carbamoyl group, and a heterocyclic group. Also, the substituents may be connected to each other to form a 5-membered, 6-membered, or 7-membered ring (such as cyclopentene ring, 1-dimethylaminocyclopentene ring, 1-diphenylaminocyclopentene ring, cyclohexene ring, 1-chlorocyclohexene ring, isophorone ring, 1-morpholinocyclopentene ring, and cycloheptene ring).

Examples of the onium ion represented by $M^{k+}$ include an alkali metal ion (such as a sodium ion, a potassium ion, and a lithium ion), an ammonium ion, an anilinium ion, a quaternary ammonium ion, an oxonium ion, a sulfonium ion, a phosphonium ion, a selenonium ion, and an iodonium ion. It is preferred that $M^{k+}$ is not a cyanine dye.

The quaternary ammonium ion is generally obtained by alkylating, alkenylating, alkynylating, or arylating a tertiary amine (such as trimethylamine, triethylamine, tributylamine, triethanolamine, N-methylpyrrolidine, N-methylpiperidine, N,N-dimethylpiperazine, triethylenediamine, and N,N,N',N'-tetramethylenediamine) or a nitrogen-containing heterocyclic compound (such as pyridine, picoline, 2,2'-bipyridyl, 4,4'-bipyridiyl, 1,10-phenanethroline, quinoline, oxazole, thiazole, N-alkylimidazole, N-alkylbenzimidzole, pyrazine, tetrazole, N-alkylpiperidine, and N-alkylmorpholine).

k represents an integer, preferably from 1 to 20, more preferably from 1 to 4, and particularly preferably 2.

The dye represented by the foregoing formula (1) or (2) can be synthesized according to the method as described in JP-A-10-109476or JP-A-2000-52658.

Specific examples of the heat decomposable dye that is used in the invention are described below, but the invention should not be construed as being limited thereto.

(1)

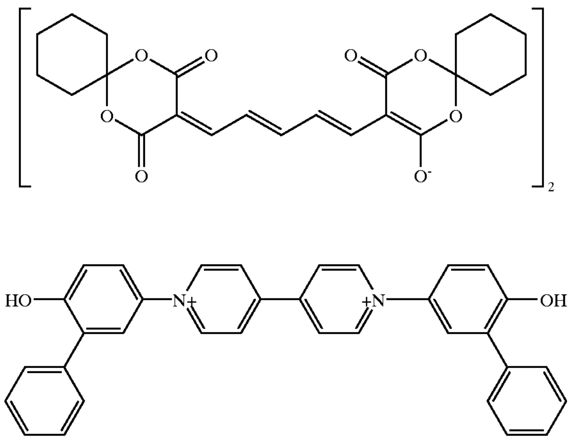

(2)

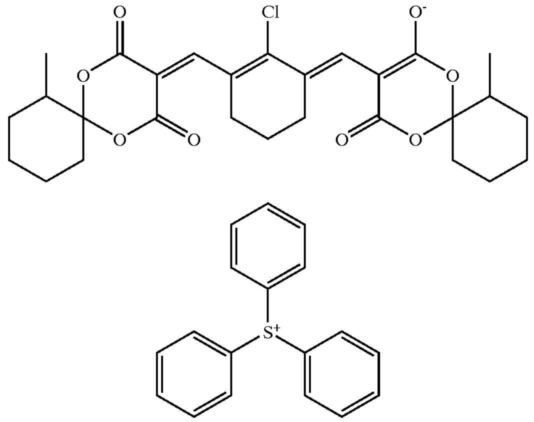

(3)

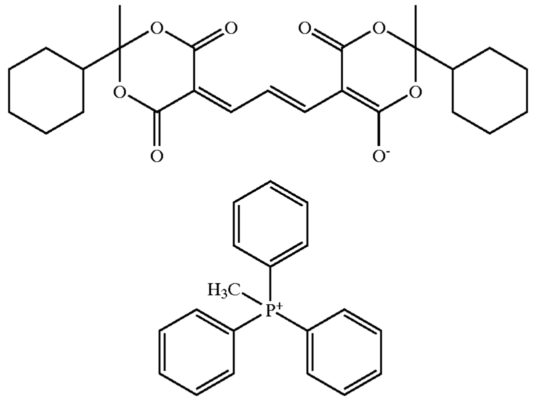

(4)

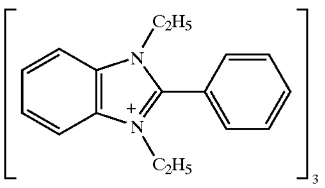

-continued
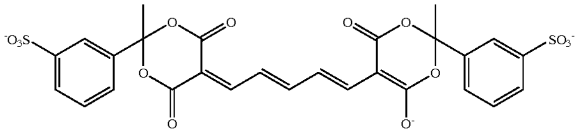
(5)
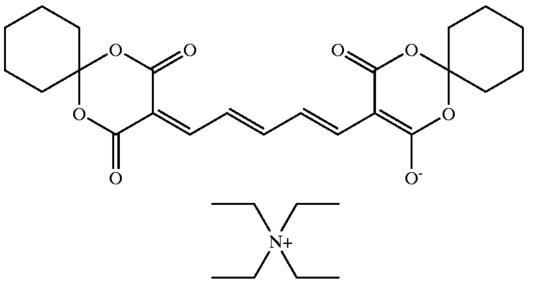
(6)
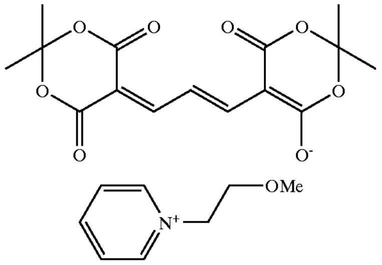
(7)
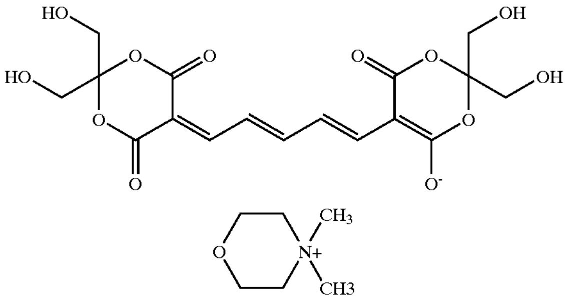
(8)
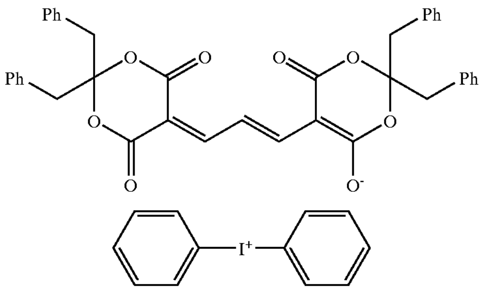
-continued
(9)
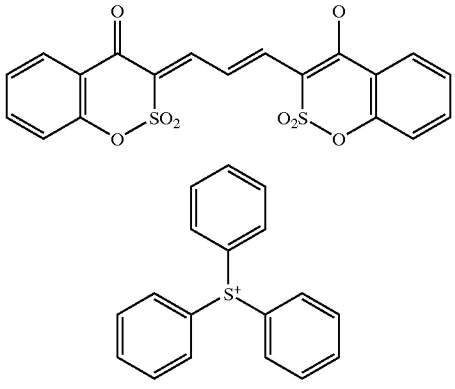
(10)
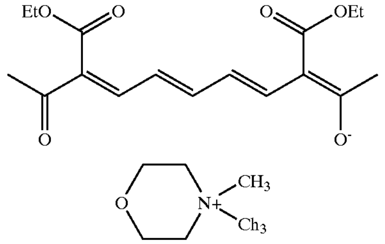
(11)
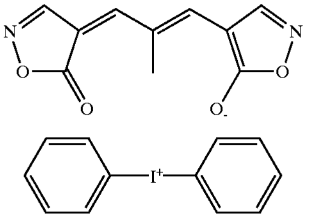
(12)
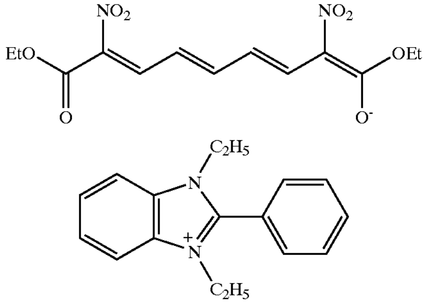
(13)
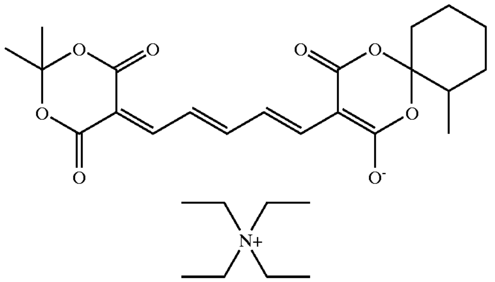

-continued (14)

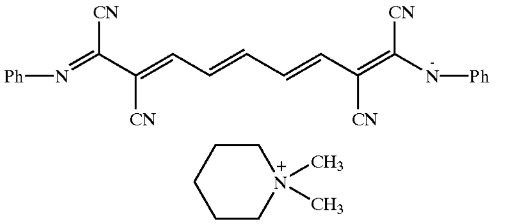

(15)

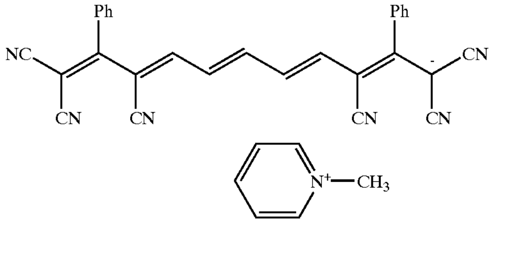

A printout element using the heat decomposable dye according to the invention can be applied to various lithographic printing plate precursors capable of drawing images by heat or heat mode exposure. Examples of the applicable lithographic printing plate precursors include those described below.

(1) A CTP lithographic printing plate precursor free from development processing, which is provided with a polarity-converting material-based image-forming layer containing an oleophilic polymer having a specified sulfonimido group, disulfone group or sulfonic ester group on the side chains thereof, the oleophilic polymer being converted into a sulfonic acid-containing hydrophilic polymer by heat and/or an acid, as described in JP-A-10-282642, JP-A-10-282644, JP-A-10-282646, and JP-A-10-282672.

(2) A CTP lithographic printing plate precursor free from development processing, which uses a polymer polarity-converting material containing a group selected from decarboxylation-causing carboxylic acid groups such as an α-sulfonylacetic acid structure and carboxylic acid salt groups, as described in JP-A-2000-122272.

(3) A positive type heat-sensitive lithographic printing plate precursor utilizing a phenomenon in which when a heat is applied to an associative polymer such as novolak resin, solubility increases, a difference in the solubility from that in areas to which the heat is not applied is caused, and development with an aqueous alkaline solution is carried out to form a positive image, as described, for example, in JP-B-46-27919 and JP-A-7-285275.

(4) A negative type heat-sensitive lithographic printing plate precursor having a heat crosslinkable layer comprising an infrared-absorptive dye that absorbs an infrared light to generate heat, a latent Brφnsted acid or s-triazine compound as an acid generator, a resole resin as a crosslinking agent, and a novolak resin as a binder as well as a polymer to be crosslinked as major components, in which after exposure with an infrared laser, the whole of the plate is heated and then developed with an aqueous alkaline solution to obtain a printing plate, as described in JP-A-7-20629 and JP-A-7-271029.

(5) A lithographic printing plate precursor capable of performing so-called development on printing press comprising a light-sensitive layer having fine particles of a thermoplastic hydrophobic polymer dispersed in a hydrophilic resin provided on a hydrophilic support, which is exposed to an infrared laser, thereby uniting (fusing) the fine particles of thermoplastic hydrophobic polymer by heat to form images, and is mounted on a printing press as it is, followed by supplying damping water and/or ink to remove non-image areas on the printing press, as described in Japanese Patent 2,938,397.

(6) A printing plate precursor of a type in which a hydrophilic layer containing a colloid such as silica is provided on an oleophilic layer, and the hydrophilic layer is subjected to ablation, as described, for example, in WO94/18005, WO98/40212, and WO99/19143; and a heat-sensitive lithographic printing plate precursor of a type of development on printing press, in which a water-soluble or hydrophilic overcoat layer is provided on a hydrophilic layer in order to prevent scattering of ablation scum, as described in JP-A-2001-96936 and JP-A-2002-86946.

(7) A lithographic printing plate precursor capable of performing so-called development on printing press comprising a light-sensitive layer having microcapsules encapsulating reactive compounds dispersed therein provided on a hydrophilic support, which is exposed to an infrared laser, thereby collapsing the microcapsules and causing reaction of the reactive compounds to form images, and is mounted on a printing press as it is, followed by supplying damping water and/or ink to remove the non-image areas on the printing press, as described in JP-A-2001-277740, JP-A-2002-137562 and JP-A-2002-46361.

Though the printout element using the heat decomposable dye according to the invention is preferably applied to the lithographic printing plate precursors as described above, it can be applied to lithographic printing plate precursors of any image-forming method so far as they can be adapted for drawing images by heat or heat mode exposure, and it is not limited to the above-described specific examples.

The heat decomposable dye that is used in the invention can be contained in an image-forming layer of the lithographic printing plate precursor. In the case where the lithographic printing plate precursor has a plurality of coating layers, the heat decomposable dye may be contained in other layers than the image-forming layer, such as an ink-accepting layer and an overcoat layer.

A content of the heat decomposable dye that is used in the invention is preferably 1% or more, and more preferably 3% or more based on the total solid content of the layer containing the heat decomposable dye. Good printout images are obtained within such a range.

In the lithographic printing plate precursor of the invention, in order to achieve high sensitization, it is preferred that a light-heat converting agent is contained in the layer containing the heat decomposable dye or a layer adjacent thereto. As the light-heat converting agent, substances absorbing infrared light, particularly near infrared light (wavelength: from 700 to 2,000 nm) are employable, and various pigments, dyes and fine metal particles can be used. For example, the pigments, dyes and fine metal particles as described in JP-A-2001-162960, JP-A-11-235883, *Journal of Japanese Society of Printing Science and Technology*, Vol. 38, pp. 35–40 (2001), and JP-A-2001-213062 are preferably used.

As the pigment, carbon black is particularly preferable. As the fine metal particles are employable fine particles of single metals or alloys selected from Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, and Sb, or oxides or sulfides thereof. Of these are preferable Re, Sb, Te, Au, Ag, Cu, Ge, Pb, and Sn, with Ag, Au, Cu, Sb, Ge, and Pb being particularly preferred. As the dye are particularly preferable water-soluble group-containing dyes as enumerated below. However, the dye is not limited thereto.

(IR-1)
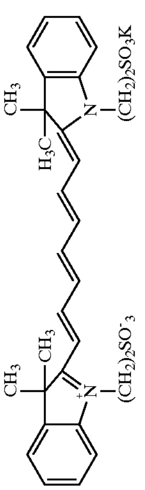
(IR-2)
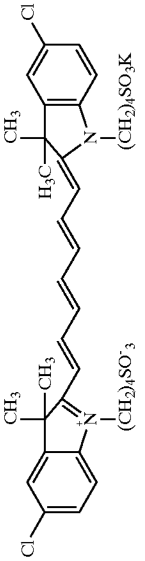
(IR-3)
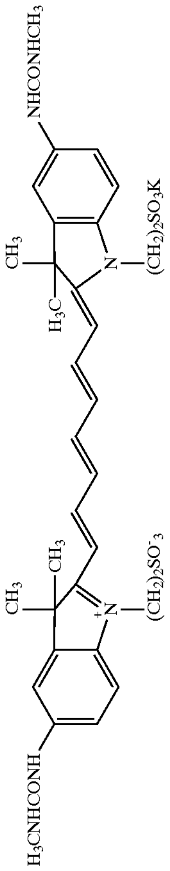
(IR-4)
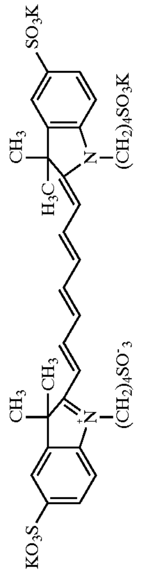
(IR-5)
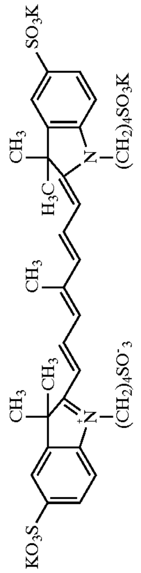
(IR-6)
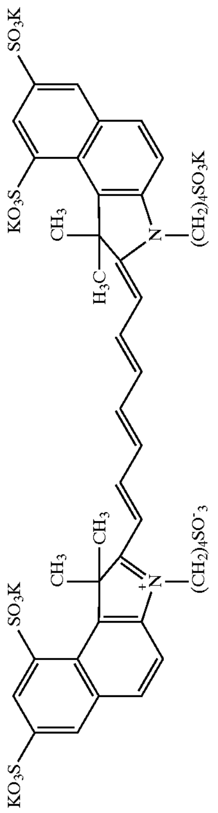

-continued
(IR-7)
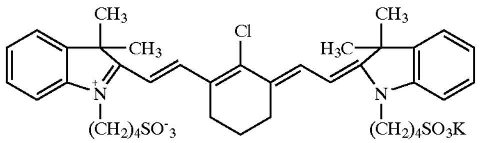
(IR-8)
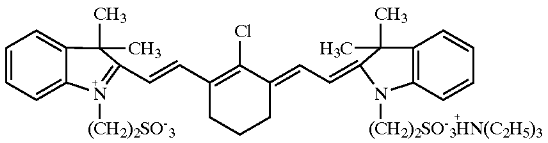
(IR-9)
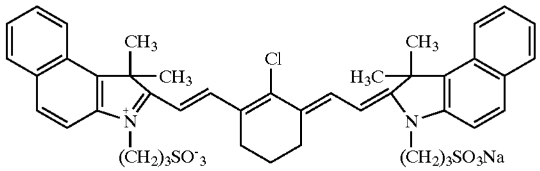
(IR-10)
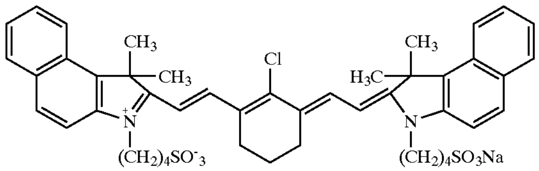
(IR-11)
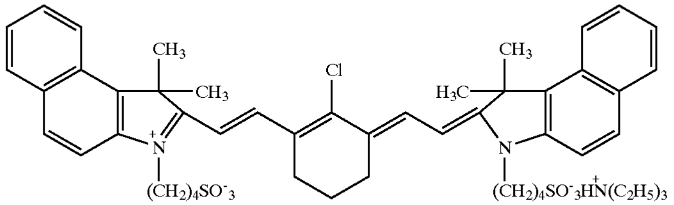

In the case where the light-heat converting agent is added, e.g., to the oleophilic ink-accepting layer or the polymer fine particles, more oleophilic dyes are preferable. Preferred examples of such dyes are illustrated below:
(IR-21)
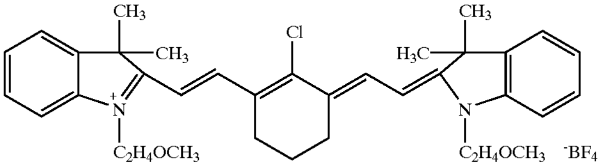
(IR-22)
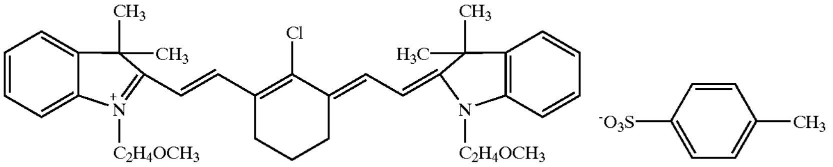
(IR-23)
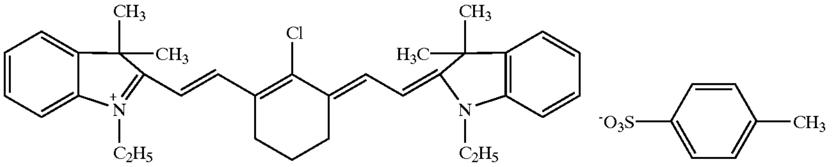
(IR-24)
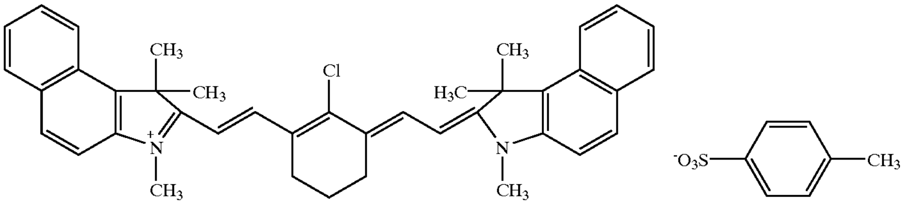
(IR-25)
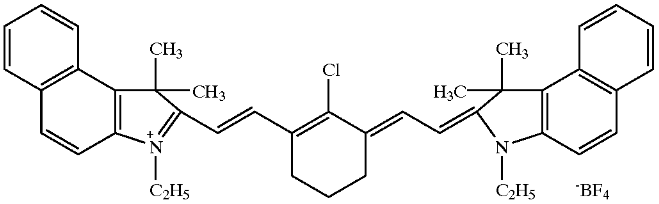
(IR-26)
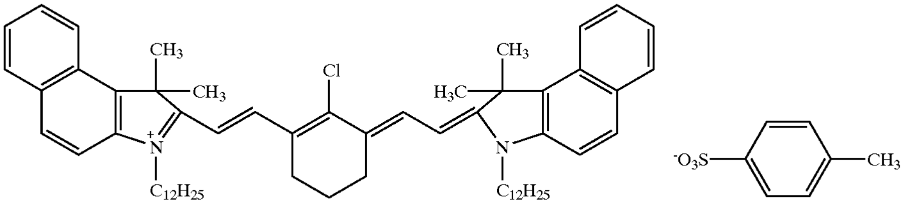

-continued (IR-27)

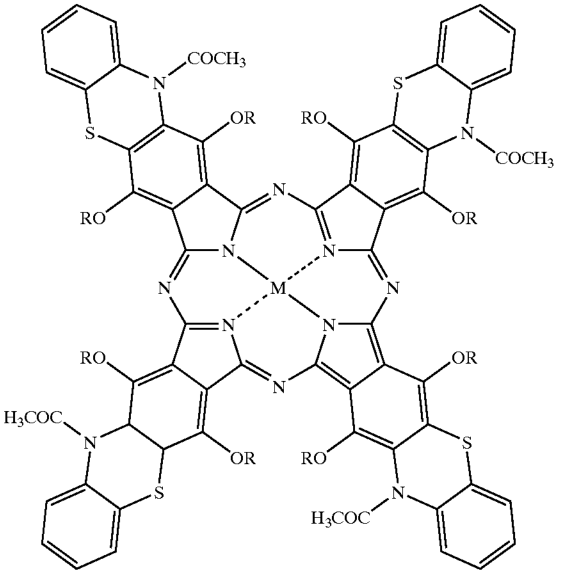

M = VO, R = i-$C_5H_{11}$ (IR-28)

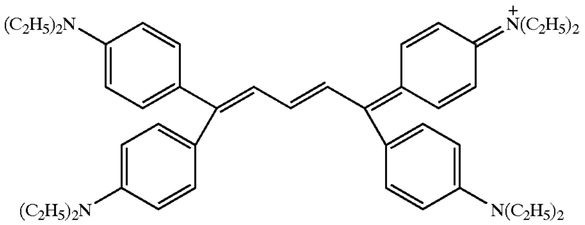

$BF^-_4$

A content of the pigment or dye as the light-heat converting agent is preferably from 0.1 to 50%, and more preferably from 3 to 40% based on the solid content of the layer containing the pigment or dye. In the case where the fine metal particles are used as the light-heat converting agent, a content of the fine metal particles is preferably 5% or more, and more preferably 10% or more based on the solid content of the layer containing the fine metal particles. Good sensitivity is obtained within such a range.

The support that is used in the invention is a substrate having a hydrophilic surface, or a substrate to which is provided a hydrophilic surface, for example, by applying a hydrophilic layer. Specific examples include paper, paper laminated with plastics (such as polyethylene, polypropylene, and polystyrene), metal sheet (such as aluminum, zinc, and copper), plastic film (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), paper or plastic film laminated or vapor deposited with the above-described metal, and those substrates having a hydrophilic layer applied thereon. Of these are particularly preferable an aluminum sheet and a polyester film having a hydrophilic layer applied thereon as the support.

As the aluminum sheet, a pure aluminum sheet, and alloy sheet comprised of aluminum as a major component and containing trace amounts of foreign elements can be used. Also, sheet comprising an aluminum or aluminum alloy thin film having a plastic layer laminated thereof can be used. Examples of the foreign element contained in the aluminum alloy include silicon, iron, manganese, copper, magnesium, chromium, zinc, bismuth, nickel, and titanium. A content of the foreign element in the alloy is at most 10%. An aluminum sheet prepared from an aluminum ingot by the DC casting process and an aluminum sheet prepared from an ingot by the continuous casting process can be used. As the aluminum sheet for use in the invention, aluminum sheets of conventionally known and used materials can be appropriately utilized.

A thickness of the support used in the invention is from 0.05 mm to 0.6 mm, preferably from 0.1 mm to 0.4 mm, and particularly preferably from 0.15 mm to 0.3 mm.

Prior to the use of aluminum sheet, it is preferred to subject the surface of the aluminum sheet to a surface processing such as roughening and anodic oxidation. By the surface processing, not only the hydrophilicity increases, but also it becomes easy to ensure the adhesion to the image-forming layer.

The roughening processing of the surface of aluminum sheet is carried out by various methods. Examples include a method for mechanical roughening, a method in which the surface is electrochemically dissolved and roughened, and a method in which the surface is chemically selectively dissolved. As the mechanical method are employable known methods such as a ball graining method, a brush graining method, a blast graining method, and a buff graining method. As the chemical method, a method in which the aluminum sheet is dipped in a saturated aqueous solution of an aluminum salt of mineral acid, as described in JP-A-54-31187, is suitable. Further, as the electrochemical roughening method, there is a method in which the aluminum sheet is processed in an electrolytic liquid containing an acid such as hydrochloric acid or nitric acid by an alternating current or a direct current. Moreover, an electrolytic roughening method using a mixed acid, as disclosed in JP-A-54-63902, can be utilized.

Preferably, the roughening by the above-described methods is carried out within the range such that centerline average roughness (Ra) of the surface of the aluminum sheet is from 0.2 to 1.0 μm.

If desired, the roughened aluminum sheet is subjected to an alkaline etching processing using an aqueous solution of potassium hydroxide or sodium hydroxide and further subjected to a neutralization processing, and then, if desired, subjected to an anodic oxidation processing in order to enhance abrasion resistance.

As an electrolyte that is used for the anodic oxidation processing of aluminum sheet, various electrolytes for forming a porous oxidized film can be used. In general, sulfuric acid, hydrochloric acid, oxalic acid, chromic acid, and a mixed acid thereof are used. A concentration of the electrolyte is appropriately determined depending on the type of the electrolyte.

The processing conditions of the anodic oxidation vary depending on the electrolyte to be used, and hence, cannot be unequivocally defined. In general, it is suitable that a concentration of the electrolyte in the electrolytic liquid is from 1 to 80%; a liquid temperature is from 5 to 70 ° C.; a current density is from 5 to 60 $A/dm^2$; a voltage is from 1 to 100V; and an electrolysis time is from 10 seconds to 5 minutes. An amount of the oxidized film formed is preferably from 1.0 to 5.0 $g/m^2$, and particularly preferably from 1.5 to 4.0 $g/m^2$.

With respect to the support used in the invention, the surface-processed substrate having an anodically oxidized film as described above may be used as it is. But, in order to more improve the adhesion to an upper layer, the hydrophilicity, the anti-staining resistance, the heat insulation, and other properties, if desired, there may be appropriately applied an enlargement process of micro-pores of the anodically oxidized film, a pore-sealing processing of micropores, and a surface-hydrophilization processing by dipping in an aqueous solution of a hydrophilic compound, as described in JP-A-2001-253181 and JP-A-2001-322365.

Examples of the hydrophilic compound suitable for the hydrophilization processing include polyvinylphosphonic acid, sulfonic acid group-containing compound, saccharide, citric acid, alkali metal silicate, potassium fluorozirconate, and phosphate/inorganic fluorine compound.

With respect to the support to be used in the invention, in the case where the hydrophilicity of the surface is insufficient as in a polyester film, it is necessary to render the surface hydrophilic, for example, by applying a hydrophilic layer. As the hydrophilic layer are preferable hydrophilic layers prepared by applying a coating liquid containing a colloid of an oxide or hydroxide of at least one element selected from beryllium, magnesium, aluminum, silicon, titanium, boron, germanium, tin, zirconium, iron, vanadium, antimony, and transition metals, as described in JP-A-2001-199175. Of these are particularly preferable hydrophilic layers prepared by applying a coating liquid containing a colloid of an oxide or hydroxide of silicon.

In the invention, prior to applying the image-forming layer, if desired, may be provided an inorganic undercoat layer containing, for example, a water-soluble metal salt such as zinc borate, or an organic undercoat layer containing, for example, carboxymethyl cellulose, dextrin, or polyacrylic acid, as described in JP-A-2001-322365. The undercoat layer may contain the above-described light-heat converting agent.

In the lithographic printing plate precursor of the invention, an image is formed by heat or heat mode exposure. Specifically, direct imagewise recording, for example, by a thermal recording head, scanning exposure by an infrared laser, high-illumination flash exposure, for example, by a xenon discharge lump, and infrared lump exposure can be used. Exposure by a solid high-output infrared laser such as a semiconductor laser or YAG laser, which radiates near infrared light having a wavelength of from 700 to 1,200 nm is preferred.

The lithographic printing plate precursor of the invention can be irradiated with a laser having a laser output of from 0.1 to 300 W. Further, in the case where a pulse laser is used, it is preferred to irradiate a laser having a peak output of not less than 1,000 W, and preferably not less than 2,000 W. In such a case, an exposure amount falls within a range such that surface exposure intensity before modulation with printing images is preferably from 0.1 to 10 $J/cm^2$, and more preferably from 0.3 to 1 $J/cm^2$. In the case where the support is transparent, the exposure can be conducted through the support from the backside of the support.

The invention will be described in detail with reference to the following Examples, but the invention should not be construed as being limited thereto.

<Preparation of Support>

A melt of an alloy of JIS-A1050, containing 99.5% or more of aluminum, 0.30% of Fe, 0.10% of Si, 0.02% of Ti, and 0.013% Cu, was subjected to a cleaning processing and then cast. In the cleaning processing, in order to remove undesirable gas in the melt, such as hydrogen, a degassing processing was carried out, and a processing with a ceramic tube filter was carried out. The casting was carried out by a DC casting process. A solidified ingot having a plate thickness of 500 mm was subjected to scraping at a depth of 10 mm from the surface, and then to a homogenization processing at 550° C. for 10 hours such that the intermetallic compounds did not become coarse. Next, the thus processed ingot was subjected to hot rolling at 400° C. and then to intermediate annealing at 500° C. for 60 seconds in a continuous annealing furnace, followed by cold rolling to obtain a rolled aluminum sheet having a sheet thickness of 0.30 mm. The roughness of the rolled aluminum sheet was controlled so as to have centerline average roughness (Ra) of 0.2 μm after the cold rolling. Thereafter, in order to improve the levelness, the aluminum sheet was made to pass through a tension leveler.

Then, in order to prepare a support for lithographic printing plate, the aluminum sheet was subjected to a surface processing. First, in order to remove rolling oil on the surface of the aluminum sheet, the aluminum sheet was degreased with a 10% sodium aluminate aqueous solution at 50° C. for 30 seconds and neutralized with a 30% sulfuric acid aqueous solution at 50° C. for 30 seconds to remove smuts. Next, in order to improve adhesion of a heat-sensitive layer to the support and impart water retention to non-image areas, the aluminum sheet was subjected to a so-called graining to roughen the surface of the support. Specifically, the aluminum web was transported in an aqueous solution containing 1% of nitric acid and 0.5% of aluminum nitrate kept at 45° C. and subjected to electrolytic graining while giving a current amount at an anode side of 240 $C/dm^2$ with an alternating waveform having a duty ratio of 1:1 at a current density of 20 A/$dm^2$ by an indirect electric supply cell. Thereafter, the aluminum sheet was subjected to an etching processing in a 10% sodium aluminate aqueous solution at 50° C. for 30 seconds and neutralized with a 30% sulfuric acid aqueous solution at 50° C. for 30 seconds to remove smuts.

Further, in order to improve abrasion resistance, chemical resistance, and water retention, an oxidized film was formed on the support by anodic oxidation. Specifically, the aluminum web was transported in a 20% sulfuric acid aqueous solution as an electrolyte at 35° C. and subjected to electrolysis at a direct current of 14 A/$dm^2$ by an indirect electric supply cell to prepare an anodized film of 2.5 g/$m^2$.

Thereafter, in order to ensure hydrophilicity of the non-image areas of printing plate, the support was subjected to a silicate processing. Specifically, the aluminum web was transported in a 1.5% No. 3 sodium silicate aqueous solution kept at 70° C. for a contact time of 15 seconds, and then washed with water. A deposition amount of Si was 10 mg/$m^2$. The thus processed support had centerline average roughness (Ra) of 0.25 μm.

<Preparation of Lithographic Printing Plate Precursor (1)>

To the support prepared above was applied an image-forming layer coating solution (A) as prepared below, followed by drying at 80° C. for 3 minutes to prepare a lithographic printing plate precursor (1). A coating amount of the image-forming layer after drying was 1.0 g/$m^2$.

| Image-forming layer coating solution (A): | |
|---|---|
| Positive type polarity-converting polymeric compound shown below | 0.450 g |
| Light-heat converting agent (IR-24) described above | 0.025 g |
| Heat decomposable dye (1) described above (Heat decomposition initiation temperature: 220° C., absorption maximum wavelength: 553 nm (in methanol)) | 0.025 g |
| Methyl ethyl ketone | 3.000 g |
| Acetonitrile | 3.000 g |

Positive Type Polarity-Converting Polymeric Compound

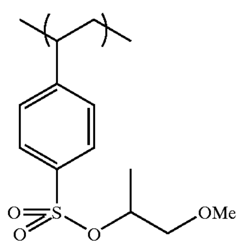

<Preparation of Lithographic Printing Plate Precursor (2)>

To the support prepared above was applied an image-forming layer coating solution (B) as prepared below, followed by drying at 80° C. for 3 minutes to prepare a lithographic printing plate precursor (2). A coating amount of the image-forming layer after drying was 1.2 g/$m^2$.

| Image-forming layer coating solution (B): | |
|---|---|
| m, p-Cresol novolak (m/p ratio: 6/4, weight average molecular weight: 3,500, containing 0.5% of unreacted cresol) | 1.00 g |

-continued

| Image-forming layer coating solution (B): | |
|---|---|
| Light-heat converting agent (IR-26) as described above | 0.20 g |
| Heat decomposable dye (1) as described above | 0.05 g |
| Fluorine-based surfactant (Megafac F-177 made by Dainippon Ink and Chemicals, Inc.) | 0.05 g |
| γ-Butyrolactone | 3.00 g |
| Methyl ethyl ketone | 8.00 g |
| 1-Methoxy-2-propanol | 7.00 g |

<Preparation of Lithographic Printing Plate Precursor (3)>

To the support prepared above was applied an image-forming layer coating solution (C) as prepared below, followed by drying at 80° C. for 3 minutes to prepare a lithographic printing plate precursor (3). A coating amount of the image-forming layer after drying was 1.2 g/$m^2$.

| Image-forming layer coating solution (C): | |
|---|---|
| Negative type polarity-converting polymeric compound shown below | 1.00 g |
| Light-heat converting agent (IR-27) described above | 0.15 g |
| Heat decomposable dye (1) described above | 0.08 g |
| Fluorine-based surfactant (Megafac F-177) | 0.05 g |
| Methyl ethyl ketone | 20.00 g |
| Methanol | 7.00 g |

Negative Type Polarity-Converting Polymeric Compound

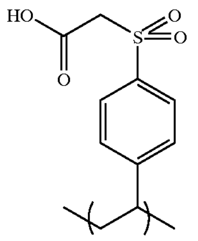

<Preparation of Lithographic Printing Plate Precursor (4)>

To the support prepared above was applied an image-forming layer coating solution (D) as prepared below, followed by drying at 80° C. for 3 minutes to prepare a lithographic printing plate precursor (4). A coating amount of the image-forming layer after drying was 1.5 g/$m^2$.

| Image-forming layer coating solution (D): | |
|---|---|
| Novolak resin obtained from phenol and formaldehyde (alkaline aqueous solution-soluble resin having a weight average molecular weight of 10,000) | 1.5 g |
| Light-heat converting agent (IR-24) described above | 0.1 g |
| Heat decomposable dye (1) as described above | 0.1 g |
| Acid generating agent (a) shown below | 0.5 g |
| Crosslinking agent (b) shown below | 0.15 g |
| Fluorine-based surfactant (Megafac F-177) | 0.03 g |
| Methyl ethyl ketone | 15 g |
| 1-Methoxy-2-propanol | 10 g |
| Methanol | 5 g |

(a)

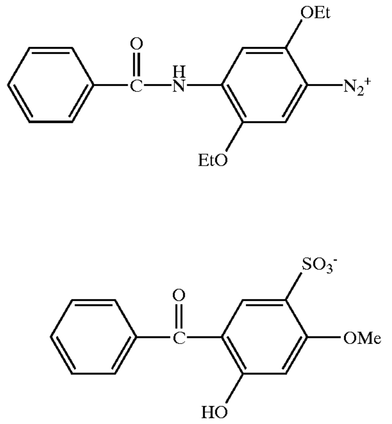

(b)

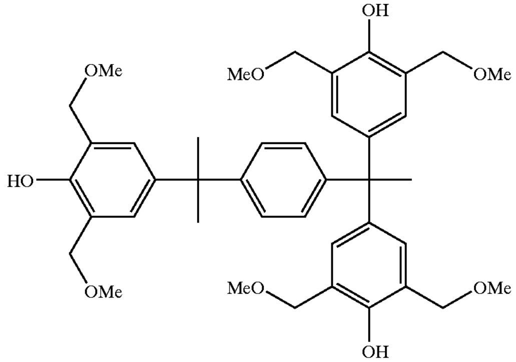

<Preparation of Dispersion of Polystyrene Fine Particles>

In 18.0 g of a solvent of ethyl acetate/MEK (4/1) were dissolved 6.0 g of polystyrene, 1.5 g of light-heat converting agent (IR-27) described above, and 0.3 g of heat decomposable dye (1) described above. The solution was mixed with 36 g of an aqueous solution containing 4% of PVA (205, made by Kuraray Co., Ltd.), and the mixture was emulsified at 10,000 rpm for 10 minutes using a homogenizer. Thereafter, the ethyl acetate and MEK were evaporated off while stirring at 60° C. for 90 minutes, to obtain a dispersion of polystyrene fine particles having an average particle size of 0.28 μm. The dispersion had solid concentration of 12%.

<Preparation of Lithographic Printing Plate Precursor (5)>

To the support prepared above was applied an image-forming layer coating solution (E) as prepared below, followed by drying at 80° C. for 3 minutes to prepare a lithographic printing plate precursor (5). A coating amount of the image-forming layer after drying was 0.8 g/m$^2$.

| Image-forming layer coating solution (E): | |
|---|---|
| Dispersion of polystyrene fine particles | 10.0 g |
| Polyacrylic acid | 0.12 g |
| Distilled water | 10.0 g |

<Preparation of Lithographic Printing Plate Precursor (6)>

To the support prepared above was applied an ink-accepting layer coating solution as prepared below, followed by drying at 80° C. for 3 minutes to prepare an ink-accepting layer. A coating amount of the ink-accepting layer after drying was 0.42 g/m$^2$.

| Ink-accepting layer coating solution: | |
|---|---|
| Epikote 1009 (epoxy resin made by Japan Epoxy Resins Co., Ltd.): | 1.2 g |
| Epikote 1001 (epoxy resin made by Japan Epoxy Resins Co., Ltd.): | 0.3 g |
| Light-heat converting agent (IR-24) described above | 0.3 g |
| Heat decomposable dye (1) described above | 0.1 g |
| Methyl ethyl ketone: | 13.5 g |
| Propylene glycol monomethyl ether: | 27.0 g |

Then, onto the ink-accepting layer was applied an image-forming layer coating solution (F) as prepared below, followed by drying at 100° C. for one minute to prepare an image-forming layer. A coating amount of the image-forming layer after drying was 0.40 g/m$^2$.

| Image-forming layer coating solution (F): | |
|---|---|
| Methanol silica sol (colloid comprising methanol solution containing 30% of silica particles having a particle size of from 10 to 20 nm, made by Nissan Chemical Industries, Ltd.): | 3.0 g |
| Polyacrylic acid (weight average molecular weight: 250,000, made by Wako Pure Chemical Industries, Ltd.): | 0.1 g |

Further, an overcoat layer coating solution as prepared below was applied thereto and dried at 100° C. for 1.5 minutes, to form an overcoat layer having a coating amount after drying of 0.15 g/m$^2$. Thus, lithographic printing plate precursor (6) was prepared.

| Overcoat layer coating solution: | |
|---|---|
| 28% Aqueous solution of gum arabic | 1.5 g |
| Light-heat converting agent (IR-10) described above | 0.042 g |
| Emalex #710 (10% aqueous solution made by Nihon Emulsion Co., Ltd.) | 0.168 g |
| Magnesium acetate tetrahydrate (10% aqueous solution, made by Wako Pure Chemical Industries, Ltd.) | 0.03 g |
| Distilled water | 30.06 g |

<Preparation of Dispersion of Microcapsules>

In a mixture of 12 g of ethyl acetate and 6 g of methyl ethyl ketone were dissolved 6.5 g of adduct of trimethylolpropane and xylylene diisocyanate (Takenate D-110N made by Mitsui Takeda Chemicals, Inc.), 2 g of oligomer of diphenylmethane diisocyanate (MR-200 made by Nippon Polyurethane Industry Co., Ltd.), 4 g of a vinyloxy compound shown below, 1.5 g of a light-heat converting agent shown below, 0.5 g of heat decomposable dye (1) described above and 0.1 g of Paionin A-41-C (made by Takemoto Oil & Fat Co., Ltd.) to prepare an oil phase component. As an aqueous phase component, 40 g of a 4% by weight aqueous solution of PVA 205 was prepared. The oil phase component and the aqueous phase component were mixed and emulsified at 12,000 rpm for 10 minutes using a homogenizer. The resulting emulsion was added to 25 g of a 1.5% by weight aqueous solution of tetraethylenepentamine, and the mixture was stirred at room temperature for 30 minutes and then at 65° C. for 3 hours. The microcapsule liquid thus prepared was diluted with distilled water so as to make the solid concentration 20% by weight. The mean particle size of the microcapsules was 0.35 μm. Vinyloxy compound

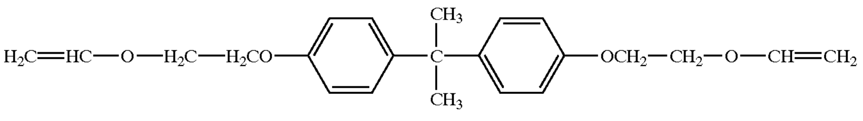

Light-Heat Converting Agent

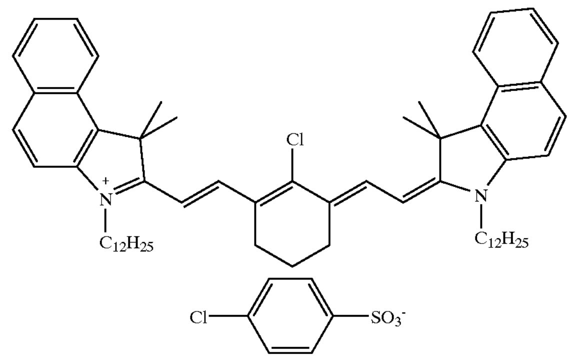

<Preparation of Lithographic Printing Plate Precursor (7)>

To the support prepared above was applied an image-forming layer coating solution (G) as prepared below, followed by drying at 60° C. for 3 minutes to prepare a lithographic printing plate precursor (7). A coating amount of the image-forming layer after drying was 1.0 g/$m^2$.

| Image-forming layer coating solution (G): | |
|---|---|
| Dispersion of microcapsules | 10 g |
| Acid precursor shown below | 0.2 g |
| Fluorine-based surfactant (Megafac F-171 made by Dainippon Ink and Chemicals, Inc.) | 0.05 g |
| Distilled water (in an amount so as to make the solid concentration of coating solution 7% by weight) | |

Acid Precursor

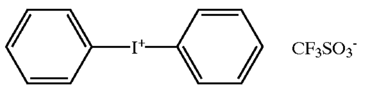

<Preparation of Comparative Lithographic Printing Plate Precursor (1')>

The same procedures as in the preparation of the lithographic printing plate precursor (1) were followed, except for using a coating solution prepared by eliminating the heat decomposable dye from the image-forming layer coating solution (A) used in the preparation of the lithographic printing plate precursor (1) to prepare a comparative lithographic printing plate precursor (1'). A coating amount of the image-forming layer after drying was 0.95 g/$m^2$.

<Preparation of Comparative Lithographic Printing Plate Precursor (2')>

The same procedures as in the preparation of the lithographic printing plate precursor (2) were followed, except for using a coating liquid prepared by eliminating the heat decomposable dye from the image-forming layer coating solution (B) used in the preparation of the lithographic printing plate precursor (2) to prepare a comparative lithographic printing plate precursor (2'). A coating amount of the image-forming layer after drying was 1.1 g/$m^2$.

<Preparation of Comparative Lithographic Printing Plate Precursor (3')>

The same procedures as in the preparation of the lithographic printing plate precursor (3) were followed, except for using a coating liquid prepared by eliminating the heat decomposable dye from the image-forming layer coating solution (C) used in the preparation of the lithographic printing plate precursor (3) to prepare a comparative lithographic printing plate precursor (3'). A coating amount of the image-forming layer after drying was 1.1 g/$m^2$.

<Preparation of Comparative Lithographic Printing Plate Precursor (4')>

The same procedures as in the preparation of the lithographic printing plate precursor (4) were followed, except for using a coating liquid prepared by eliminating the heat decomposable dye from the image-forming layer coating solution (D) used in the preparation of the lithographic printing plate precursor (4) to prepare a comparative lithographic printing plate precursor (4'). A coating amount of the image-forming layer after drying was 1.5 g/$m^2$.

<Preparation of Comparative Lithographic Printing Plate Precursor (5')>

The same procedures as in the preparation of the lithographic printing plate precursor (5) were followed, except for using a dispersion of fine particles prepared by eliminating the heat decomposable dye from the dispersion of polystyrene fine particles used in the preparation of the lithographic printing plate precursor (5) to prepare a comparative lithographic printing plate precursor (5'). A coating amount of the image-forming layer after drying was 0.8 g/$m^2$.

<Preparation of Comparative Lithographic Printing Plate Precursor (6')>

The same procedures as in the preparation of the lithographic printing plate precursor (6) were followed, except for using an ink-accepting layer coating liquid prepared by eliminating the heat decomposable dye from the ink-accepting layer coating solution used in the preparation of the lithographic printing plate precursor (6) to prepare a comparative lithographic printing plate precursor (6'). A coating amount of the ink-accepting layer after drying was 0.42 g/$m^2$. A coating amount of the image-forming layer after drying was 0.40 g/$m^2$. A coating amount of the overcoat layer after drying was 0.15 g/$m^2$.

<Preparation of Comparative Lithographic Printing Plate Precursor (7')>

The same procedures as in the preparation of the lithographic printing plate precursor (7) were followed, except for using a dispersion of microcapsules prepared by eliminating the heat decomposable dye from the dispersion of microcapsules used in the preparation of the lithographic printing plate precursor (7) to prepare a comparative lithographic printing plate precursor (7'). A coating amount of the image-forming layer after drying was 1.0 g/$m^2$.

EXAMPLES 1 TO 7 AND COMPARATIVE EXAMPLES 1 TO 7

Each of the thus prepared lithographic printing plate precursors was installed in Trendsetter 3244VX made by CreoScitex and irradiated with an energy as described in Table 1 to form latent image. After the exposure, the lithographic printing plate precursor was visually observed, and the printout property was evaluated according to the following criteria: A=good and B=poor. Then, of the precursors each having latent image formed therein, the precursors (1), (3), (5), (6), (7), (1'), (3'), (5'), (6') and (7') were mounted as they were without being processed on an SOR-M printing press made by Heidelberg, and subjected to printing in a usual manner. Further, the precursors (2) and (2') each having latent image formed therein were developed by using an automatic processor (PS Processor 900VR made by Fuji Photo Film Co., Ltd.) charged with a developing solution (DP-4 made by Fuji Photo Film Co., Ltd.) and a rinsing solution (FR-3 made by Fuji Photo Film Co., Ltd.) (1:7), and then subjected to printing in the same manner as described above. Moreover, the precursors (4) and (4') each having latent image formed therein were heated in an oven at 140° C. for one minute, and then developed and subjected to printing in the same manner as in the precursors (2) and (2') The results obtained are set forth in Table 1.

TABLE 1

Examples 1 to 7 and Comparative Examples 1 to 7

| | Lithographic Printing Plate Precursor | Exposure Energy ($mJ/cm^2$) | Printout Property | Number of Prints (×10,000) |
|---|---|---|---|---|
| Example 1 | (1) | 400 | A | 5 |
| Example 2 | (2) | 150 | A | 8 |
| Example 3 | (3) | 400 | A | 4 |
| Example 4 | (4) | 200 | A | 10 |
| Example 5 | (5) | 250 | A | 2 |
| Example 6 | (6) | 240 | A | 2 |
| Example 7 | (7) | 400 | A | 4 |
| Comparative Example 1 | (1') | 400 | B | 5 |
| Comparative Example 2 | (2') | 150 | B | 8 |
| Comparative Example 3 | (3') | 400 | B | 4 |
| Comparative Example 4 | (4') | 200 | B | 10 |
| Comparative Example 5 | (5') | 250 | B | 2 |
| Comparative Example 6 | (6') | 240 | B | 2 |
| Comparative Example 7 | (7') | 400 | B | 4 |

From the results shown in Table 1, it can be seen that in any of the lithographic printing plate precursors of the Examples, the printout property was good, and the drawn images could be clearly confirmed. On the other hand, in any of the comparative lithographic printing plate precursors not containing the heat decomposable dye, the printout property was poor, and it was difficult to distinctly confirm the drawn images. In addition, all of the lithographic printing plate precursors of the Examples and Comparative Examples had equivalent sensitivity and printing durability, and thus influences against other printing performances brought by the addition of heat decomposable dye were not observed.

According to the invention, a lithographic printing plate precursor having good printout property, which is capable of drawing images by heat or heat mode exposure, can be obtained.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor having an image-forming layer capable of forming images by heat or heat mode exposure and development with an aqueous alkaline solution, which comprises a support and a layer containing a heat decomposable dye having an absorption maximum wavelength in a visible region, not substantially having an absorption in an oscillation wavelength of a laser used for heat mode exposure, and having a heat decomposition initiation temperature of 250° C. or lower.

2. The lithographic printing plate precursor as claimed in claim 1, wherein the heat decomposable dye has a structure represented by the following formula (1) or (2):

(1)

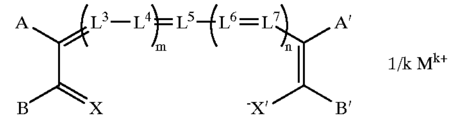

(2)

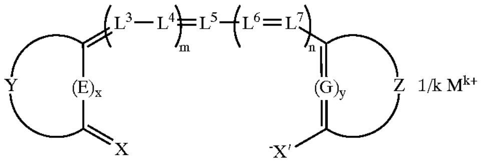

wherein A, A', B, and B' each independently represents a substituent; Y and Z each represents an atomic group necessary for forming a carbon ring or a heterocyclic ring; E and G each represents an atomic group to complete a conjugated double bond chain; X and X' each represents oxygen, N-R. or $C(CN)_2$; R represents an alkyl group or an aryl group; $L^3$, $L^4$, $L^5$, $L^6$, and $L^7$ each represents a methine group which may be substituted; $M^{k+}$ represents an onium ion; m and n each independently represents 0, 1, or 2; x and y each independently represents 0 or 1; and k represents an integer of 1 or more.

3. The lithographic printing plate precursor as claimed in claim 1, wherein the image-forming layer comprises a hydrophobic polymer compound that can be rendered hydrophilic by heat and has a functional group selected from a sulfonic ester group, a sulfonimido group and a disulfone group.

4. The lithographic printing plate precursor as claimed in claim 1, wherein the image-forming layer comprises fine particles of a thermoplastic hydrophobic polymer.

5. The lithographic printing plate precursor as claimed in claim 1, wherein the image-forming layer comprises microcapsules encapsulating an oleophilic compound.

6. A lithographic printing plate precursor having an image-forming layer capable of drawing images by heat or heat mode exposure, which comprises a support and a layer containing a heat decomposable dye having an absorption maximum wavelength in a visible region, not substantially having an absorption in an oscillation wavelength of a laser used for heat mode exposure, and having a heat decomposition initiation temperature of 250° C. or lower, wherein the lithographic printing plate precursor is a lithographic printing plate precursor that can be mounted directly on a printing press without a development processing after exposure.

7. The lithographic printing plate precursor as claimed in claim 2, wherein the heat decomposable dye has a structure represented by the following formula (1) or (2):

(1)

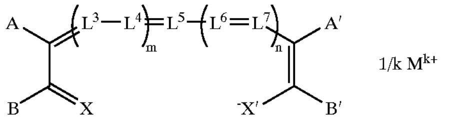

(2)

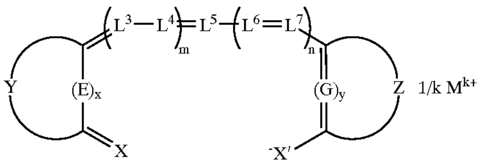

8. The lithographic printing plate precursor as claimed in claim 6, wherein the image-forming layer comprises a hydrophobic polymer compound that can be rendered hydrophilic by heat and has a functional group selected from a sulfonic ester group, a sulfonimido group and a disulfone group.

9. The lithographic printing plate precursor as claimed in claim 6, wherein the image-forming layer comprises fine particles of a thermoplastic hydrophobic polymer.

10. The lithographic printing plate precursor as claimed in claim 6, wherein the image-forming layer comprises microcapsules encapsulating an oleophilic compound.

11. A lithographic printing plate precursor having an image-forming layer capable of drawing images by heat or heat mode exposure, which comprises a support, an oleophilic layer containing a heat decomposable dye having an absorption maximum wavelength in a visible region, not substantially having an absorption in an oscillation wavelength of a laser used for heat mode exposure, and having a heat decomposition initiation temperature of 250° C. or lower, and a hydrophilic layer in this order.

* * * * *